United States Patent [19]

Nakata

[11] 3,914,782

[45] Oct. 21, 1975

[54] REVERSE CONDUCTING THYRISTOR AND PROCESS FOR PRODUCING THE SAME

[75] Inventor: Josuke Nakata, Itami, Japan

[73] Assignee: Mitsubishi Denki Kabushiki Kaisha, Japan

[22] Filed: June 6, 1973

[21] Appl. No.: 367,430

[30] Foreign Application Priority Data

June 8, 1972 Japan .............................. 47-57193

[52] U.S. Cl. ...................... 357/38; 357/12; 357/39; 357/55; 357/68; 357/89

[51] Int. Cl.[2] ........................................ H01L 29/74

[58] Field of Search .......... 317/235 AB; 357/38, 39, 357/12, 20, 55, 68, 86, 89

[56] References Cited

UNITED STATES PATENTS

| | | | |
|---|---|---|---|
| 3,360,696 | 12/1967 | Neilson et al. | 317/235 |
| 3,414,780 | 12/1968 | Diebold | 317/234 |
| 3,562,610 | 2/1971 | Stehney | 317/235 |
| 3,622,841 | 11/1971 | Zoroglu | 317/235 AA |
| 3,634,739 | 1/1972 | Borchert et al. | 317/235 |
| 3,641,403 | 2/1972 | Nakata | 357/38 |
| 3,699,402 | 10/1972 | McCann et al. | 357/38 |
| 3,727,116 | 4/1973 | Thomas et al. | 357/38 |
| 3,758,832 | 9/1973 | Platzoner | 317/235 R |

*Primary Examiner*—Andrew J. James
*Assistant Examiner*—Joseph E. Clawson, Jr.
*Attorney, Agent, or Firm*—Robert E. Burns; Emmanuel J. Lobato; Bruce L. Adams

[57] ABSTRACT

A circular semiconductor wafer includes a thyristor surrounded by a diode through an annular V-shaped groove-filled with glass. That face of the wafer near to the extremity of the groove is disposed on a molybdenum plate through a brazing layer. A base layer on both faces of the wafer has those portions extending through the associated emitter region at predetermined positions to be exposed to the wafers faces to form degenerate P-N junctions on and adjacent that face with the adjacent emitter portions. The brazing layer and the opposite electrode for the thyristor include small openings looking the exposed portions of the base layers and the adjacent emitter portions respectively.

8 Claims, 4 Drawing Figures

REVERSE CONDUCTING THYRISTOR AND PROCESS FOR PRODUCING THE SAME

BACKGROUND OF THE INVENTION

This invention relates to a reverse conducting thyristor device including a thyristor unit and a diode unit interconnected in reverse parallel circuit relationships, i.e., in parallel with opposite polarities and formed into a single semiconductor device and a process of producing the same.

The above described type of reverse conducting thyristor devices has previously comprised a thyristor unit surrounded by a diode unit in a single wafer of semiconductive material and a pair of electrodes disposed in ohmic contact with the opposite main faces of the wafer to be common so as to both units and serving to shortcircuit emitter junctions formed between a plurality of discrete emitter regions disposed on each surface of the wafer and the associated base layer of the thyristor unit with a central gate electrode disposed in ohmic contact with one of the base layer within a central opening of the associated electrode. The shorted emitter configuration as above described is advantageous in that at high temperatures or with high rates of increase in forward voltage the turn-off time decreases to render the forward blocking ability high, but it is disadvantageous in that the emitter function is impeded because the emitter regions and the adjacent base layer are shortcircuited on the surface of the junction by the associated electrode.

SUMMARY OF THE INVENTION

Accordingly it is an object of the invention to provide a new reverse conducting thyristor device increased in maximum values of di/dt and surge current and preventing interferences of one with the other of diode and thyristor units involved while substantially retaining the advantages of shorted emitter configuration reverse conducting thyristors devices of the conventional construction and to provide a process of producing reverse conducting thyristor devices as above described.

The present invention accomplishes this object by the provision of a reverse conducting thyristor device comprising, in combination, a single support member forming one of a pair of main electrodes a wafer of semiconductive material including a first semiconductor region disposed upon the supporting member and including four semiconductive layers of alternate conductivity to form a thyristor unit, and a second semiconductor region juxtaposed in parallel opposition to the first semiconductor region upon the supporting member, the second semiconductor region including two semiconductive layers different in conductivity type from each other to form a diode unit, the thyristor unit having an electrode portion disposed on that surface thereof opposite to the supporting member, the diode unit having another electrode portion disposed on that surface thereof opposite to the supporting member, both the electrode portions being independent of each other but forming together the other of the main electrodes, and groove means formed between the thyristor unit and the diode unit to separate to P-N junction included in the diode unit away from an intermediate P-N junction included in the thyristor unit through the same.

In a preferred embodiment of the present invention, the thyristor unit may be a circular cross section and the diode unit is annular to surround the thyristor unit through the groove means. The groove means may be filled with an electrically insulating material preferably with glass.

At least one of the electrode operatively coupled to the thyristor units may be advantageously provided with a plurality of small openings, each of which has exposed thereto both one portion of the associated emitter region and that portion of the base layer adjacent the emitter region whereby that electrode including said plurality of small openings is isolated from the adjacent base layer through the emitter region.

BRIEF DESCRIPTION OF THE DRAWING

The present invention will become more readily apparent from the following detailed description taken in conjunction with the accompanying drawing in which.

DESCRIPTION OF THE PREFERRED EMBODIMENTS

Figure 1:
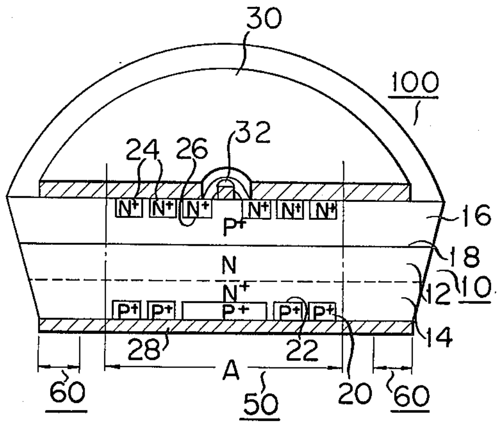
FIG. 1 PRIOR ART
FIG. 1 is a fragmental perspective view, partly in section of a reverse conducting thyristor device constructed in accordance with the principles of the prior art.

Referring now to the drawing and FIG. 1 in particular, it is seen that a reverse conducting thyristor device of the conventional construction is generally designated by the reference numeral 100 and comprises a disc-shaped silicon wafer generally designated by the reference numeral 10. The silicon wafer 10 includes an N type base layer 12, an $N^+$ type base layer 14 disposed on one surface, in this case, a lower surface as viewed in FIG. 1 of the N type base layer 12, and a $P^+$ type base layer 16 disposed on the other or upper surface of the base layer 12 to form a collector junction 18 therebetween. A collector junction 18 is a forward blocking junction for the thyristor. The $N^+$ type base layer 14 has formed on the central portion thereof a $P^+$ type central anode emitter region in the form of a disc and a plurality, in this case two of $P^+$ type annular anode emitter regions concentrically encircling the central emitter region. These anode emitter regions designated by the reference numeral 20 form individual anode emitter junctions 22 between the same and the $N^+$ type base layer 14 and have respective exposed surface surrounded by the exposed surface portions of the base layer 14. Similarly, the $P^+$ type base layer 16 has formed on the central portion thereof a plurality, in this case, three of $P^+$ type cathode emitter regions 24 in the form of concentric annuli to form individual cathode emitter junctions 26 therebetween. The emitter regions 24 have respective exposed surfaces surrounded by exposed surface portions of the $P^+$ type base layer 16.

Then a pair of main electrodes are disposed in ohmic contact with the opposite main faces of the silicon wafer 10. More specifically, an anode electrode 28 is disposed in ohmic contact with both the $N^+$ type base layer 14 and the $P^+$ type anode emitter regions 18 to partially shortcircuit the anode emitter junctions 22 while a cathode electrode 30 having a central opening is disposed in ohmic contact with both the $P^+$ type base layer 16 and the $N^+$ type cathode emitter regions 24 to partially shortcircuit the cathode emitter junctions 26. A gate electrode 32 is disposed within the central opening on the cathode electrode 30 and in ohmic contact with the $P^+$ type base layer 16.

Therefore it will be seen that the arrangement of FIG. 1 has formed in the central portion thereof designated by the reference character "A" a thyristor unit having a four layer construction and an shorted emitter configuration and on the peripheral portion thereof a diode unit utilizing a P-N junction formed of the extension of the collector junction 18. The thyristor and diode units are generally designated by the reference numerals 50 and 60 respectively.

The reverse conducting thyristor device 100 as shown in FIG. 1 is responsive to a voltage applied thereto with such a polarity that the anode electrode 28 is higher in potential than the cathode electrode 30 to selectively put in two state one of which blocks the resulting current and the other of which permits it to flow therethrough. Therefore thyristor device of FIG. 1 is utilized as a switching device.

On the other hand, if a voltage opposite in polarity to that just described is applied across the thyristor device 100 then the collector junction 18 will be forwardly biased to permit a high current forward with respect to the junction 18 to flow through both the diode 60 and the emitter shortcircuiting portions or those portion disposed between the emitter regions of the base layers 14 and 16 on the anode and cathode sides in the thyristor unit 50. Thus a single thyristor device such as shown in FIG. 1 could be substituted for a combination of separate thyristor and diode interconnected in reverse parallel circuit relationship. The use of such reverse conducting thyristor devices in inverters and/or chopper circuit is effective for eliminating adverse effects resulting from stray inductance and the like caused from the wiring.

However the thyristor devices such as shown in FIG. 1 have several disadvantages. For example, the forward blocking ability may be lost with a flow of high current through both the diode unit 60 and the emitter shortcircuiting portion of the base layer on either of the anode and cathode sides in the thyristor unit 50 for the following reasons: The flow of high current through the diode unit and those emitter shortcircuiting portions causes the carrier to be excessively accumulated in both the $P^+$ type base layer 16 and the N type base layer 12 and then the accumulated carriers are laterally moved through the base layers 16, 12 and 14 of the thyristor unit 50. Under these circumstances, if a voltage applied across the thyristor device 100 is suddenly reversed in polarity, the thyristor unit 50 may be broken over with a low voltage due to the influence of the lateral movement of the carriers as above described. This results in the loss of the forward blocking ability. In order to avoid this disadvantage, it has been previously practiced to restrict the current flowing through the diode unit to a certain magnitude or to decrease a rate of decrease in a diode current or $-di/dt$. Therefore the design and manufacture of reverse conducting thyristors has previously encountered various difficulties. For example, in order to interrupt the diffusion of the minority carriers from one to the other of the diode and thyristor units 60 and 50 respectively, the thyristor unit 50 could be provided with an intermediate zone into which a large amount of a lifetime killer such as gold is diffused thereby to prevent the excessive carriers from flowing into the thyristor unit 50. By the term "lifetime killer" is meant a material for depriving the carriers of their lifetime. Alternatively, that portion of the main electrode in ohmic contact with the diode unit could be separated away from that in ohmic contact with the thyristor unit to form an intermediate zone. Then the prevention of such a flow of the excessive carriers resorted to the resistance effect exhibited by the semiconductor layers due to this intermediate zone. Particularly the process of selectively diffusing a lifetime killer into the intermediate zone alone has not only included the complicated processing steps but also it has brought about fears such as a decrease in the withstanding voltage, an increase in the forward voltage drop and so on. In either of the measures as above described, it has been scarcely possible practically to eliminate the effect of small diode portions formed in the thyristor unit 50, that is to say, diodes formed therein by shortcircuiting the emitter junctions on the anode and cathode sides of the thyristor unit.

Reverse conducting thyristor devices of the conventional construction have encountered a serious problem in shortcircuiting the emitter junctions thereof. At higher temperatures or at high rates of increase in the forward voltage, the shorted emitter configuration serves to decrease the turn-off time thereby to increase the forward blocking ability but it is disadvantageous in that, the emitter function is impeded because the emitter region is shortcircuited with the adjacent base layer on the surface of their junction through the associated electrode. Particularly, with the thyristor device put in its conducting state, the electrode picks up the excessive carriers to be accumulated in the base layer in the vicinity of the emitter shortcircuiting portion. This leads to a decrease in carrier concentration required for the turn-on plasm to be spread and therefore to affecting the maximum rate of increase in a load current $dv/dt$ withstood by thyristors.

Also the shortcircuiting of the emitter junction causes a decrease in a voltage applied across the junction and particularly at high current levels such as surge current levels and the forward voltage drop across thyristors becomes high as compared with those having the emitter junction not shortcircuited. These disadvantages have been remarkable for reverse conducting thyristor devices such as shown in FIG. 1 wherein the emitter junction are shortcircuited on each of the anode and cathode sides.

Figure 2:
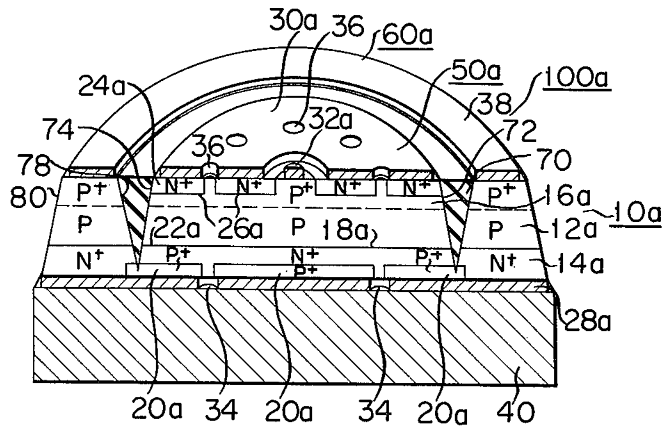
FIG. 2 is a fragmental perspective view, partly in section of a reverse conducting thyristor device constructed in accordance with the principles of the present invention.

Referring now to FIG. 2 wherein like reference numerals suffixed with the reference character "*a*" designate the components corresponding or similar to those shown in FIG. 1, there is shown one half of a reverse conducting thyristor device of circular cross section constructed in accordance with the principles of the present invention and axially divided along a diametric plane. The arrangement illustrated has a circular wafer of any suitable semiconductive material, in this case, silicon including a P type substrate layer forming a P type base layer **12*a*, an $N^+$ type base layer 14*a* disposed on surface or a lower surface as viewed in FIG. 2 of the P type base layer 12*a* to form a P-N junction 18*a* therebetween and a $P^+$ type base layer 16*a* disposed on the other or upper surface of the P type base layer 12*a*. The $N^+$ type base layer 14*a* is formed by highly doping an N type impurity into the wafer 40$a$ or a substrate of P type silicon from the one or lower surface thereof while the $P^+$ type base layer 16**$a$ is formed by highly doping a P type impurity in the substrate from the other or upper surface thereof.

Then a selective diffusion technique is used to highly dope a P type impurity into the $N^+$ type base layer 14$a$ on the central portion of relatively large area to form a $P^+$ type anode emitter layer or region 20$a$ in the form of a disc having a predetermined number of small "windows" 34 occupied by the material of the $P^+$ type base layer 16$a$ after having extended through the emitter region 20$a$ with the windows 34 disposed at predetermined substantially equal angular intervals and equidistantly from the central axis of the wafer 10$a$. A P-N junction 22$a$ is formed between the $N^+$ type base layer 14$a$ and the $P^+$ type emitter region 20$a$. Similarly an N type impurity is highly doped into the $P^+$ type base layer 16$a$ to form an $N^+$ type cathode emitter layer region 24$a$ in the form of a circular annulus concentric with the wafer and having one small "window" 36 axially aligned with each of the windows 34 on the $N^+$ type base layer 20$a$. The material of the $P^+$ type base layer 16$a$ is exposed to the windows 36 after having extended through the cathode emitter region 24$a$. A P-N junction 26$a$ is formed between the $P^+$ type base layer 16$a$ and the $N^+$ type cathode emitter region 24$a$.

The three P-N junctions 18$a$, 22$a$ and 26$a$ are collector junction across which a forward blocking voltage is applied, an anode emitter junction and a cathode emitter junction respectively. The junction 18$a$ may be sometimes called an "intermediate junction."

The $P^+$ type emitter region 20$a$ and the $N^+$ type base layer 14$a$ have very high impurity concentrations on the surface whose values are preferably in the order of $1 \times 10^{20}$ and $5 \times 10^{19}$ atoms per cubic centimeter respectively. Similarly the $N^+$ type emitter region 24$a$ and the $P^+$ type base layer 16$a$ have respective impurity concentration as high as about $5 \times 10^{20}$ and $5 \times 10^{19}$ atoms per cubic centimeter. Those highly doped layers have respective impurity concentrations gradually decreased from the maximum values on their surfaces as the depths thereof increase. Thus the portions of the anode emitter junction disposed adjacent surface of the window 34 on the $N^+$ type base layer 14$a$ and those portions of the cathode emitter junction disposed adjacent the surface of the windows 36 on the $P^+$ type base layer 16$a$ form degenerate P-N junctions providing leakage paths of the emitter junctions through which a tunnel current or a recombination current can pass at low voltages.

As shown in FIG. 2, the wafer 10$a$ has a supporting metallic disc 40 rigidly secured to the lower face thereof through a layer 28$a$ of any suitable brazing material including a plurality of circular openings each aligned with a different one of the windows 34 on the $N^+$ type base layer 14$a$ and slightly greater in diameter from the latter. Thus that portion of the anode emitter region 20$a$ adjacent each window 34 and that portion of the $N^+$ type layer 14$a$ forming the window 34 can see through the associated opening in the brazing layer 28. The brazing layer 28 serves as an anode electrode. The supporting disc 40 is preferably of molybdenum and extensive with the lower face of the wafer 10$a$.

A metallic cathode electrode 30$a$ in the form of a circular annulus is disposed in ohmic contact with the $N^+$ type cathode emitter region 24$a$ and provided with circular openings aligned with and slightly greater in diameter than the windows 36 on the $P^+$ type base layer 16$a$. Further a small metallic gate electrode 32$a$ is disposed within a central circular opening on the cathode electrode 30$a$ having a diameter somewhat greater than the inside diameter of the annulus 30$a$ and in ohmic contact with the $P^+$ type base layer 16$a$.

That portion of the wafer 10$a$ disposed under the cathode electrode 30$a$ forms a thyristor unit 50$a$ with the anode and cathode electrodes 28$a$ and 30$a$ respectively.

An annular metallic electrode 38 is disposed in ohmic contact with the peripheral edge portion of the $P^+$ type base layer 16$a$ so as to be spaced away from the outer periphery of the cathode electrode 30$a$ by a predetermined distance. The peripheral edge portion of the wafer 10$a$ disposed under the annular electrode 38 forms a diode unit 60$a$ along with the electrodes 38 and 28$a$.

The cathode electrode 30$a$ and the diode electrode 38 are formed together into a single cathode member by using an external wiring for example by having a common conductor contacted thereby. Then the cathode member thus formed is connected in a main circuit with the supporting disc 40 while a gating circuit is connected between the gate electrode 32$a$ and the cathode member.

Figure 3:
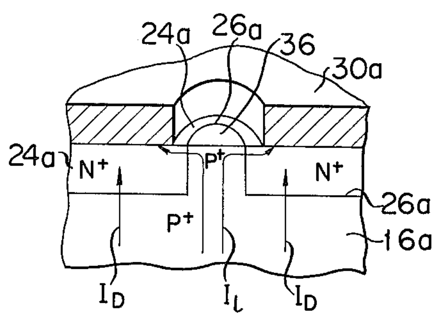
FIG. 3 is an enlarged perspective view, partly in section of one portion of the device shown in FIG. 2.

FIG. 3 shows, in an enlarged scale, one of the windows 36 on the $P^+$ type base layer 16$a$ and also illustrates a current path $I_l$ along which a tunnel or recombination current flows through that portion of the cathode emitter junction 26$a$ adjacent to the window 36. As the current $I_l$ increases, a voltage drop across the leakage path extending through the window 36 also increases resulting in an increase in a diffusion current $I_D$ flowing from the $P^+$ type base layer 16$a$ through the interior of the cathode emitter junction 26$a$. After the diffusion current $I_D$ has increased to a certain magnitude, electrons from the cathode emitter region 74$a$ are injected into the base layers 16$a$ and 12$a$ tending to turn the thyristor unit 50$a$ on. The circular edge of the cathode emitter junction 26$a$ exposed to the window 36 may have preferably a resistance in the order of 20 ohms per unit length of the junction. The diameter, the number or density and the distribution pattern of windows and therefore of the openings on the electrode should be determined by the forward blocking voltage, $dv/dt$ rating, switching characteristic etc. required for the particular thyristor. Thus while the cathode electrode 30$a$ is shown in FIG. 2 as including eight openings disposed at substantially equal angular intervals on a circle it is to be understood that the number and arrangement of those openings and therefore of the windows may be changed from what is illustrated in FIG. 1.

Since the resistance of the leakage path as above described has a negative temperature coefficient of resistance, within a range of operating temperatures, it tends to decrease in resistance with an increase in temperature. This leads to one characteristic features that a breakover current increases at higher temperatures.

The brazing layer 28$a$ through which the supporting plate 40 serving as the anode electrode is rigidly secured to the wafer 10$a$ is contacted by the $P^+$ type anode emitter region 20$a$ with a low resistance formed therebetween but not directly by the $N^+$ type base layer 14$a$ due to its openings positioned upon windows 34 on the base layer 14$a$. Also the annular cathode electrode 30$a$ is contacted by the $N^+$ type emitter region 24$a$ with a low resistance formed therebetween but not directly by the $P^+$ type base layer 16$a$. Therefore the brazing layer 28$a$ is electrically connected on and adjacent the windows 34 to the $N^+$ type base layer 14$a$ through a resistances presented by the respective leakage paths or shunt resistances. This is true in the case of the cathode electrode 30$a$.

As shown in FIG. 2, the thyristor unit 50$a$ has exposed to the central portion of the surface on the cathode side or the upper surface as viewed in FIG. 2 a central portion of the $P^+$ type base layer 16$a$ forming a gate region. Then the gate electrode 32$a$ is disposed in ohmic contact with the central portion of the $P^+$ type base layer 16$a$. A portion of the cathode emitter junction 26$a$ formed of those portions of the $P^+$ type base layer 16$a$ and the $N^+$ type cathode emitter region 24$a$ exposed to the gate region is required to be higher in resistance than the junction portion around the surface of each window 36. To this end, the surface layer high in impurity concentration is removed from the surface of the junction in question as by etching the latter surface. This is effective for preventing a current required for gate triggering from becoming unnecessarily higher.

Figure 4:
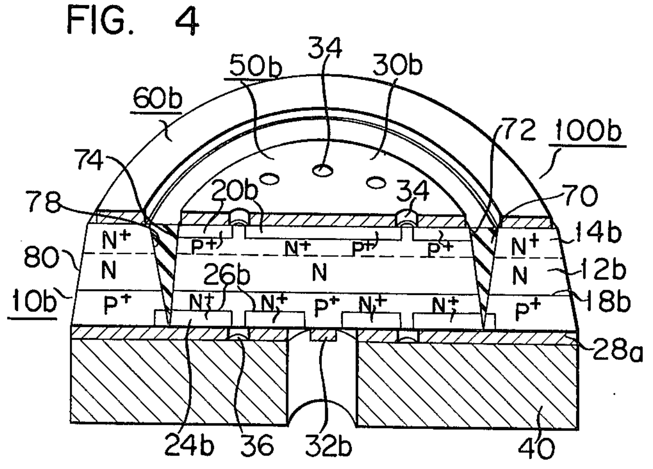
FIG. 4 is a view similar to FIG. 2 but illustrating a modification of the present invention.

As shown in FIG. 4, the thyristor unit 50$a$ is surrounded by the diode unit 60$a$ through an annular groove 70 of V-shaped cross section filled with any suitable electrically insulating material 72 such as glass. The annular V-shaped groove 70 has its opening substantially coextensive with the annular spacing between the circular cathode electrode 30$a$ and the annular electrode 38 and terminates within the anode emitter region 20$a$ on the outer peripheral portion. The groove 70 serves to divide the junction 18$a$ into the collector junction for the thyristor unit 30$a$ and a P-N junction for the diode unit 60$a$. Similarly, those portions of the $N^+$, P and $P^+$ layers 14$a$, 12$a$ and 16$a$ respectively disposed in the diode unit 60$a$ are those separated away from the corresponding layers in the thyristor unit 50$a$ by the V-shaped groove 70. Simultaneously the V-shaped groove 70 serves to taper the thyristor unit 50$a$ toward the cathode electrode 30$a$. That is, the periphery of the thyristor unit 50$a$ is defined by the upwardly and inwardly tilted wall surface 74 of the V-shaped groove 70 to gradually decrease the cross sectional area of the unit toward the cathode electrode. The groove 70 includes the other wall surface 78 serving to gradually decrease the cross sectional area of the diode unit 60$a$ from the supporting plate 40 toward the upper annular electrode 38 with the initially tilted surface 80 of the wafer 10$a$.

With the edges of the collector and diode junctions 18$a$ exposed to the tilted surface 74, 78 and 80, a strength of electric field on the surface adjacent the exposed edge of the P-N junction is less than that in the portion beneath that surface. This will readily be understood from the fact that the layer 14$a$ on one side of the junction 18$a$ higher in impurity concentration and hence resistivity is larger in cross sectional area than the layer 12$a$ on the other side of the junction lower in impurity concentration and hence resistivity. In other words, the respective impurity concentrations have been predetermined so as to provide a positive bevel.

The annular groove 70 as above described can be formed by first removing the wafer's material disposed between the thyristor and diode units 50$a$ and 60$a$ into a V-shaped as shown in FIG. 2 through sandblasting. Then the surface of the V-shaped groove 70 thus formed is etched as in the conventional surface treatment of P-N junctions. Thereafter the groove 70 is filled with an electrically insulating material 72. It has been found that such a material is preferably glass although any other electrically insulating material may be used. With glass used a powder of glass fills the annular groove 70 and is heated to a temperature above its softening point. After having been cooled, the glass is fused to the semiconductive material of both units. This measure is effective for maintaining the surface adjacent the exposed edge of the P-N junction as well as isolating it from the surrounding air.

It will be appreciated that the tilted surface 80 of the diode unit 60$a$ is processed in the same manner as does the annular groove 70, for purpose of protecting the surface 80 against the atmosphere although an electrically insulating coating therefore is not illustrated in FIG. 2.

It is to be understood that the annular groove 70 of V-shaped cross section is not required to have its depth sufficient to completely divide the wafer 10$a$ into the thyristor and diode units 50$a$ and 60$a$. It has been found that the groove is sufficient to divide the intermediate high resistivity layer 12$a$ so that the thyristor and diode units 50$a$ and 60$a$ include their own portions of that layers separated away from each other. In the latter event, interferences of one with the other of the thyristor and diode units are fairly improved to such an extent that the object of the present invention can be attained.

From the foregoing it will be appreciated that the thyristor unit 50$a$ and the diode unit 60$a$ are fixedly secured to the supporting molybdenum plate 40 through the brazing layer 28$a$ and rigidly bonded to each other through the insulating material 72 filling the annular groove 70 of V-shaped cross section formed therebetween and in substantially electrically insulated relationship with each other. The semiconductive layers included in each of the thyristor and diode units have been initially continuous to the corresponding layers included in the other unit and separated away from the latter by means of the annular groove of V-shaped cross section.

The arrangement of FIG. 2 is formed by using, as a starting material, a wafer of P type silicon, forming the $N^+$ and $P^+$ type base layers 14$a$ and 16$a$ respectively in the wafer through the utilization of diffusion technique well known in the art, and forming the emitter regions 20$a$ and 24$a$ on both surfaces of the wafer through the utilization of selective diffusion technique also well known in the art, while the windows 34 and 36 as above described are formed on 40 both surface of the wafer.

Then the wafer thus processed is fixed to the supporting molybdenum plate 40 through the brazing layer 28$a$. The groove 70 is formed in the wafer as by sandbasting. After the well known surface treatment, the groove 70 is filled with an electrically insulating material such as glass. The arrangement is completed by attaching the electrodes 30$a$, 32$a$ and 38 to that surface of the wafer opposite to the supporting plate 40.

In FIG. 4 wherein like reference numerals with or without the suffixed character $b$ instead of $a$ have been employed to identify the components idential or corresponding to those shown in FIG. 2, there is illustrated a modification of the present invention. In the arrangement illustrated, the semiconductor wafer 10b including the N type substrate layer 12b is supported on the side of the $P^+$ type base layer 16b upon the supporting molybdenum plate 40 in the form of a circular annulus through the brazing layer 28b with the gate electrode 32b centrally disposed in ohmic contact with the $P^+$ type base layer 16b and within the central opening on the annular supporting plate 40. Thus the supporting plate 40 serves as the cathode electrode while the circular electrode 30a in ohmic contact with the $N^+$ type base layer 14b serves as the anode electrode. The diode electrode 38 is disposed in ohmic contact with the $N^+$ type base layer 14b rather than the $P^+$ type base layer 16b. In other respects, the arrangement is substantially identical to that shown in FIG. 2.

The arrangement of FIG. 4 is formed by repeating the process as above described in conjunction with FIG. 2 exception that an N type wafer is used as a starting material.

From the illustration of FIGS. 2 and 4, it will be understood that the present invention is equally applicable to either of P and N type reverse conducting thyristor devices.

In order to provide the effects similar to those of the shorted emitter configurations without using the latter, each of the anode and cathode emitter regions has been shown in FIG. 2 or 4 as including the windows to which the material of the mating base layer is exposed without relying on conventional electrodes for short-circuiting the emitter region with the adjacent base layer. If desired, either one of the anode and cathode emitter regions may include such windows. Also instead of the windows, that portion of the emitter junction substantially parallel to the collector junction may partially include junctions so high in leakage that, at a low current levels, that is, a level of leakage current developed in the blocking state of the thyristor, a current approximating that flowing through the ohmic contact portion is permitted to flow through those junctions.

In the arrangement as shown in each of FIGS. 2 and 4, the intermediate P-N junction in the thyristor unit is not continuous to that in the diode unit and the base layers of the thyristor unit are interrupted from corresponding ones of the diode unit by means of the annular groove but the emitter region on each of the anode and cathode sides within the thyristor unit is not directly shortcircuited with the associated base layer through the electrode. Therefore, upon reversely biasing the thyristor unit, a current forwardly flowing through the collector junction 18a or 18b is caused to reversely flow through the emitter junctions thereby to be limited by the impedance thereof. Thus the forward current becomes very low so that the accumulation of the carriers is decreased. In the present device, no movement of the carriers occurs between the diode and thyristor units interconnected in reverse parallel circuit relationship. This ensures that the present device does not fail to perform the commutation operation.

Also the leakage paths or the windows 12 or 13 operatively coupled with the anode and/or cathode emitter junctions according to the present invention serve to reduce the injection efficiency of the emitter region at low current levels such as a current level established in the forward blocking state thereby to preserve the forward blocking ability. Further since each of the leakage paths has a some resistance, and the spread of the plasma during the conduction of the thyristor is very small affected as in the conventional type of shorted emitter configuration reverse conducting thyristors. As a result, the present thyristor device has the advantages that the turn-on time thereof is decreased and a maximum value of *di/dt* withstood by the device becomes high. In addition, the thyristor device is improved in withstanding surge voltages.

One of the characteristic features of the present invention is to readily provide a positive bevel for the P-N junction intersecting the peripheral surface of the semiconductor wafer involved through the use of conventional sandblasting. This results in the advantages that the area required to provide the positive bevel is low in loss and the withstanding voltage can be high. Further the present invention also retains the advantages exhibited by conventional reverse conducting thyristors and can decrease in both forward voltage drop and switching time because the substrate or high resistivity base layer can be minimized in thickness as compared with conventional reverse blocking thyristors. Also, since the injection efficiency of the emitter region on either of the anode and cathode sides can be decreased at low current levels, a decrease in forward blocking voltage can be small at high temperatures or with applied voltages high in *dv/dt*. In addition, the thyristor and diode units formed in a single wafer of semiconductive material are fixed to a common supporting plate while both units are electrically separated away from each other by the annular groove. This measure completely eliminates the necessity of limiting magnitudes of a current flowing through the diode unit and a negative derivative thereof (*—di/dt*) in order to prevent a failure of commutation. Therefore the present invention can provide reverse conducting thyristor devices very low in stray inductance.

While the present invention has been illustrated and described in conjunction with a few preferred embodiments thereof, it is to be understood that numerous changes and modifications may be resorted to without departing from the spirit and scope of the invention.

What we claim is:

1. A unitary semiconductor device, comprising, in combination, a single supporting member forming one of a pair of main electrodes, a wafer of semiconductor material including a first semiconductor region disposed upon said supporting member and including four superposed semiconductive layers of alternate conductivity to form a reverse conducting thyristor unit, and a second semiconductor region juxtaposed and circumferentially of said first semiconductor region upon said supporting member, said second semiconductor region including two of said semiconductive layers different in conductivity type from each other to form a diode unit, said thyristor unit having an electrode portion disposed on a surface thereof opposite to said supporting member, said diode unit having another electrode portion disposed on said surface thereof opposite to said supporting member, said electrode portion and said another electrode portion being independent of each other but forming together the other main electrode, at least one of said main electrode and said electrode portion of said other main electrode having a plurality of openings therethrough to expose portions of the outermost semiconductive layer of said first semiconductor region adjacent thereto, an intermediate layer of said first semiconductor region adjacent the outermost semiconductive layer partially exposed through said openings having portions extending through the outermost semiconductor layer and exposed through said openings and dimensioned so as to be separated from said main electrode and said electrode portion, said outermost semiconductive layer adjacent the respective one of said main electrode and said electrode portion being doped to form with the adjacent intermediate semiconductive layer adjacent thereto a PN junction having degenerate portions at the portions of said intermediate semiconductive layer extending through said outermost semiconductive layer, and a groove disposed between said thyristor and diode units and of sufficient depth to completely separate said four semiconductive four layers into said first and second semiconductor regions and to separate a P-N junction included in said diode unit away from an intermediate P-N junction included in said thyristor unit through the same.

2. A unitary semiconductor device as claimed in claim 1, wherein each of said P-N junction in said diode unit and said intermediate P-N junction in said thyristor unit is formed of a high resistivity semiconductor layer and a low resistivity semiconductive layer of opposite conductivity disposed so that said high resistivity semiconductive layer is more remote from said supporting member than said low resistivity semiconductive layer and wherein a peripheral surface bounding said groove around each of said P-N junctions comprises a positive bevel on which the associated semiconductive layers decrease in crosssectional area in a direction away from said supporting member.

3. A unitary semiconductive device as claimed in claim 1, wherein said diode unit completely circumferentially surrounds said thyristor unit.

4. A unitary semiconductive device as claimed in claim 3, wherein said groove is filled with an electrically insulating material.

5. A unitary semiconductive device as claimed in claim 3, wherein said groove is filled with an electrically insulating glass.

6. A unitary semiconductive device as claimed in claim 1, wherein said thyristor unit has both electrodes isolated from the adjacent base layers through respective emitter regions forming emitter junctions between the same and said base layers, at least one of said emitter junctions including partially degenerate P-N junctions.

7. A unitary semiconductive device as claimed in claim 3, wherein said electrode portion on said thyristor unit is in the form of a plate and said another electrode portion on said diode unit is annular surrounding said electrode portion on said thyristor unit through a predetermined insulating space.

8. A reverse conducting thyristor device comprising, a wafer of semiconductive material including four semiconductor layers of alternate conductivity, a pair of main electrodes locally disposed in ohmic contact with the outermost two of said semiconductor layers, a gate electrode locally disposed in ohmic contact with one of the two intermediate semiconductor layers, said main electrodes and said gate electrode forming a thyristor unit with the associated portions of said semiconductor layers, at least one of said main electrodes having a plurality of openings therethrough to expose portions of the underlying outermost semiconductor layer of said thyristor unit, the intermediate semiconductor layer adjacent the outermost semiconductor layer exposed through said openings having portions extending through said underlying outermost semiconductor layer and exposed through said openings, said portions of said intermediate semiconductor layer extending through said outermost layer forming degenerate PN junctions therewith and being dimensioned to be separated from said main electrodes, another pair of main electrodes disposed in ohmic contact with the surfaces of those portions extending outwardly, and laterally from those portions of said two intermediate semiconductor layers included in said thyristor unit, said another pair of main electrodes forming a diode unit with the associated portions of said laterally extending portions of said two intermediate semiconductor layers, and means for connecting said main electrodes of said thyristor unit to main electrodes of said diode unit, and wherein a groove is disposed between said thyristor unit and said diode unit to separate said two intermediate semiconductor layers of said thyristor unit from the two semiconductor layers included in said diode unit.

* * * * *